United States Patent
Yang

(10) Patent No.: US 10,297,587 B2
(45) Date of Patent: May 21, 2019

(54) INTEGRATED CIRCUIT

(71) Applicant: MediaTek Inc., Hsin-Chu (TW)

(72) Inventor: Jen-Hang Yang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 71 days.

(21) Appl. No.: 15/697,715

(22) Filed: Sep. 7, 2017

(65) Prior Publication Data

US 2017/0365594 A1 Dec. 21, 2017

Related U.S. Application Data

(63) Continuation of application No. 14/297,965, filed on Jun. 6, 2014, now Pat. No. 9,786,645.

(60) Provisional application No. 61/900,624, filed on Nov. 6, 2013.

(51) Int. Cl.
*H01L 27/02* (2006.01)
*H01L 27/118* (2006.01)

(52) U.S. Cl.
CPC .... *H01L 27/0207* (2013.01); *H01L 27/11807* (2013.01); *H01L 2027/11874* (2013.01)

(58) Field of Classification Search
CPC .................................................. H01L 27/0207
USPC ......................................................... 716/119
See application file for complete search history.

(56) References Cited

U.S. PATENT DOCUMENTS

| | | | |
|---|---|---|---|
| 4,623,911 A | 11/1986 | Pryor | |
| 5,283,753 A | 2/1994 | Schucker et al. | |
| 5,814,846 A | 9/1998 | Essbaum et al. | |
| 7,508,256 B2 | 3/2009 | Hillman et al. | |
| 8,772,881 B2 | 7/2014 | Masuoka et al. | |
| 2007/0083842 A1* | 4/2007 | Namba | G06F 17/5072 257/208 |
| 2008/0246091 A1 | 10/2008 | Kondo et al. | |
| 2011/0049575 A1* | 3/2011 | Tanaka | H01L 27/11807 257/206 |
| 2012/0286331 A1* | 11/2012 | Aton | H01L 27/0207 257/202 |
| 2013/0313615 A1 | 11/2013 | Tzeng | |
| 2015/0123730 A1* | 5/2015 | Yang | H01L 27/0207 327/566 |
| 2016/0086932 A1* | 3/2016 | Chen | H01L 27/0207 257/369 |

FOREIGN PATENT DOCUMENTS

| | | |
|---|---|---|
| CN | 101558492 A | 10/2009 |
| CN | 10190854 A | 12/2010 |

* cited by examiner

*Primary Examiner* — Suresh Memula
(74) *Attorney, Agent, or Firm* — McClure, Qualey & Rodack, LLP

(57) ABSTRACT

An integrated circuit is provided. In one implementation, the integrated circuit includes a first standard cell, comprising at least one first PMOS transistor disposed in a first row in a semiconductor substrate and at least one first NMOS transistor disposed in a first area of a second row in the semiconductor substrate, and a second standard cell, comprising a plurality of second PMOS transistors disposed in the first row and a third row in the semiconductor substrate and a plurality of second NMOS transistors disposed in a second area of the second row in the semiconductor substrate, wherein the second row is adjacent to the first and third rows and arranged between the first and third rows.

17 Claims, 4 Drawing Sheets

US 10,297,587 B2

INTEGRATED CIRCUIT

CROSS REFERENCE TO RELATED APPLICATIONS

This Application is a continuation of pending U.S. application Ser. No. 14/297,965, filed on Jun. 6, 2014, which claims priority of U.S. Provisional Application No. 61/900,624, filed on Nov. 6, 2013, the entireties of which are incorporated by reference herein.

BACKGROUND OF THE INVENTION

Field of the Invention

The invention relates to an integrated circuit, and more particularly to a standard cell of an integrated circuit.

Description of the Related Art

In semiconductor design, standard cell methodology is a method of designing application-specific integrated circuits (ASICs) with mostly digital-logic features. A standard cell is formed by a plurality of transistor and interconnect structures that provide a Boolean logic function (e.g. AND, OR, XOR, XNOR, inverters) or a storage function (e.g. flip-flop or latch). The standard cells are realized as fixed-height, variable-width full-custom cells. The standard cells are arranged in rows in a semiconductor substrate. In between the rows are routing areas for interconnecting the standard cells. Furthermore, power leafs may also be arranged through the routing areas or may have designed areas overlying the standard cells.

In order to simplify the ASIC design process, various vendors have developed various standard cell libraries. Use of the standard cells is advantageous to save time and cost for designing various ASICs. Furthermore, the standard cells are typically optimized full-custom layouts, which minimize delays and area.

BRIEF SUMMARY OF THE INVENTION

Integrated circuits are provided. An embodiment of an integrated circuit is provided. In one embodiment, the integrated circuit includes a first standard cell, comprising at least one first PMOS transistor disposed in a first row in a semiconductor substrate and at least one first NMOS transistor disposed in a first area of a second row in the semiconductor substrate, and a second standard cell, comprising a plurality of second PMOS transistors disposed in the first row and a third row in the semiconductor substrate and a plurality of second NMOS transistors disposed in a second area of the second row in the semiconductor substrate, wherein the second row is adjacent to the first and third rows and arranged between the first and third rows.

Furthermore, in another embodiment, the integrated circuit comprises; a first standard cell, comprising at least one first NMOS transistor disposed in a first row in a semiconductor substrate and at least one first PMOS transistor disposed in a first area of a second row in the semiconductor substrate; and a second standard cell, comprising a plurality of second PMOS transistors disposed in a third row and a second area of the second row in the semiconductor substrate and a plurality of second NMOS transistors disposed in a fourth row in the semiconductor substrate. The second row is adjacent to the first and fourth rows and arranged between the first and fourth rows, and the fourth row is adjacent to the second and third rows and arranged between the second and third rows.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
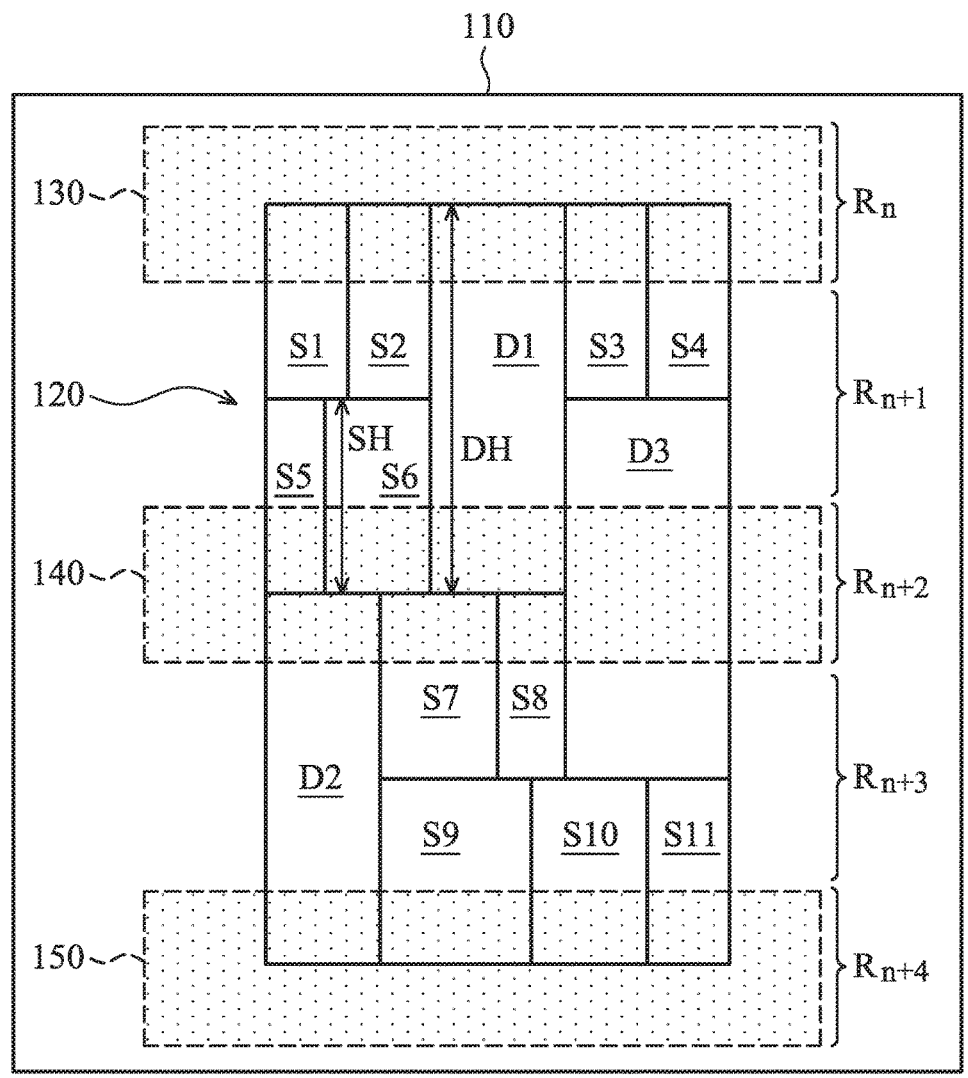
FIG. 1 shows an integrated circuit according to an embodiment of the invention.

FIG. 1 shows an integrated circuit 100 according to an embodiment of the invention. The integrated circuit 100 comprises a plurality of standard cells disposed in a plurality of rows in a semiconductor substrate 110. In FIG. 1, the standard cells S1-S11 and the standard cells D1-D3 form a standard cell array 120, and the standard cells S1-S11 and D1-D3 are arranged in the rows $R_n$-$R_{n+4}$, wherein a N-well 130 is formed in the row $R_n$, a N-well 140 is formed in the row $R_{n+2}$, and a N-well 150 is formed in the row $R_{n+4}$. In one embodiment, the P-wells can be formed in the rows $R_{n+1}$ and $R_{n+3}$. Specifically, the rows with N-wells (e.g. $R_n$, $R_{n+2}$ or $R_{n+4}$) and the rows without N-wells (e.g. $R_{n+1}$ or $R_{n+3}$) are alternately arranged in the semiconductor substrate 110. Furthermore, each of the standard cells S1-S11 is a single height cell having a height SH, and each of the standard cells D1-D3 is a double height cell having a height DH. The height DH is substantially twice the height SH, and the double height cell is capable to provide a high speed operation with high density. Furthermore, the double height cell will benefit area and power reduction under low speed application. The layout differences between the single height cell and the double height cell will be described below.

Figure 2:
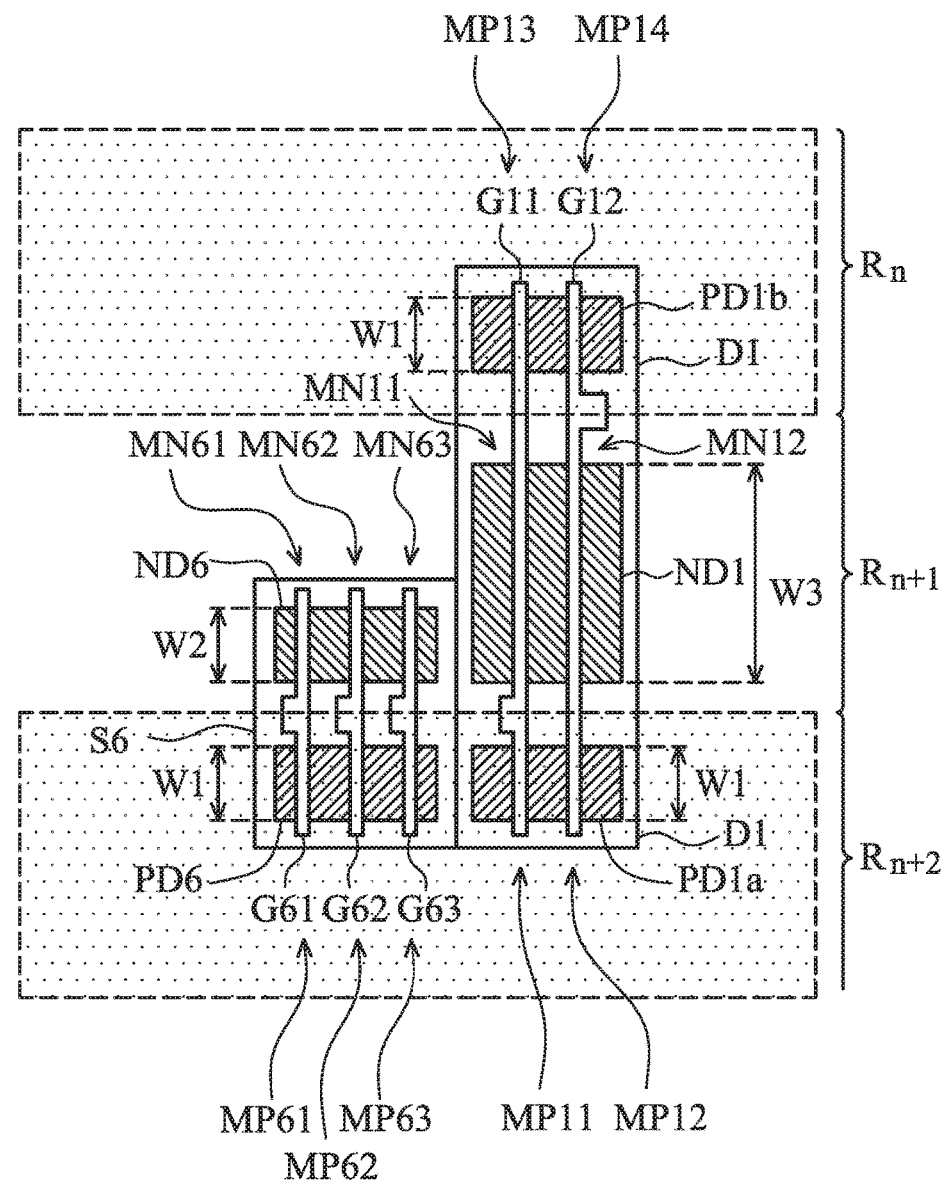
FIG. 2 shows an example illustrating a layout diagram of the standard cells S6 and D1 of FIG. 1 according to an embodiment of the invention.

FIG. 2 shows an example illustrating a layout diagram of the standard cells S6 and D1 of FIG. 1 according to an embodiment of the invention. The standard cell S6 comprises three PMOS transistors MP61-MP63 and three NMOS transistors MN61-MN63. A gate G61 and a P+ doping region PD6 adjacent to the gate G61 form the PMOS transistor MP61, a gate G62 and the P+ doping region PD6 adjacent to the gate G62 form the PMOS transistor MP62, and a gate G63 and the P+ doping region PD6 adjacent to the gate G63 form the PMOS transistor MP63. Furthermore, the gate G61 and an N+ doping region ND6 adjacent to the gate G61 form the NMOS transistor MN61, the gate G62 and the N+ doping region ND6 adjacent to the gate G62 form the NMOS transistor MN62, and the gate G63 and the N+ doping region ND6 adjacent to the gate G63 form the NMOS transistor MN63. The standard cell D1 comprises four PMOS transistors MP11-MP14 and two NMOS transistors MN11-MN12. A gate G11 and a P+ doping region PD1$a$ adjacent to the gate G11 form the PMOS transistor MP11, a gate G12 and the P+ doping region PD1$a$ adjacent to the gate G12 form the PMOS transistor MP12. The gate G11 and a P+ doping region PD1$b$ adjacent to the gate G11 form the PMOS transistor MP13, and the gate G12 and the P+ doping region PD1$b$ adjacent to the gate G12 form the PMOS transistor MP14. It is to be noted that a quantity of the PMOS transistors in the P+ doping region PD1$b$ of the row $R_n$ is equal to a quantity of the PMOS transistors in the P+ doping region PD1$a$ of the row $R_{n+2}$. Furthermore, the gate G11 and an N+ doping region ND1 adjacent to the gate G11 form the NMOS transistor MN11, and the gate G12 and the N+ doping region ND1 adjacent to the gate G12 form the NMOS transistor MN12. In the rows $R_n$ and $R_{n+2}$, the P+ doping regions PD6, PD1$a$ and PD1$b$ have the same height (e.g. W1), thus each gate of the PMOS transistors in the standard cell S6 and each gate of the PMOS transistors in the standard cell D1 have the same width W1. In the row $R_{n+1}$, a height (e.g. W3) of the N+ doping region ND1 is at least twice a height (e.g. W2) of the N+ doping region ND6, thereby each gate of the NMOS transistors in the standard cell D1 has at least twice width of each gate of the NMOS transistors in the standard cell S6, i.e. W3≥2×W2.

Figure 3:
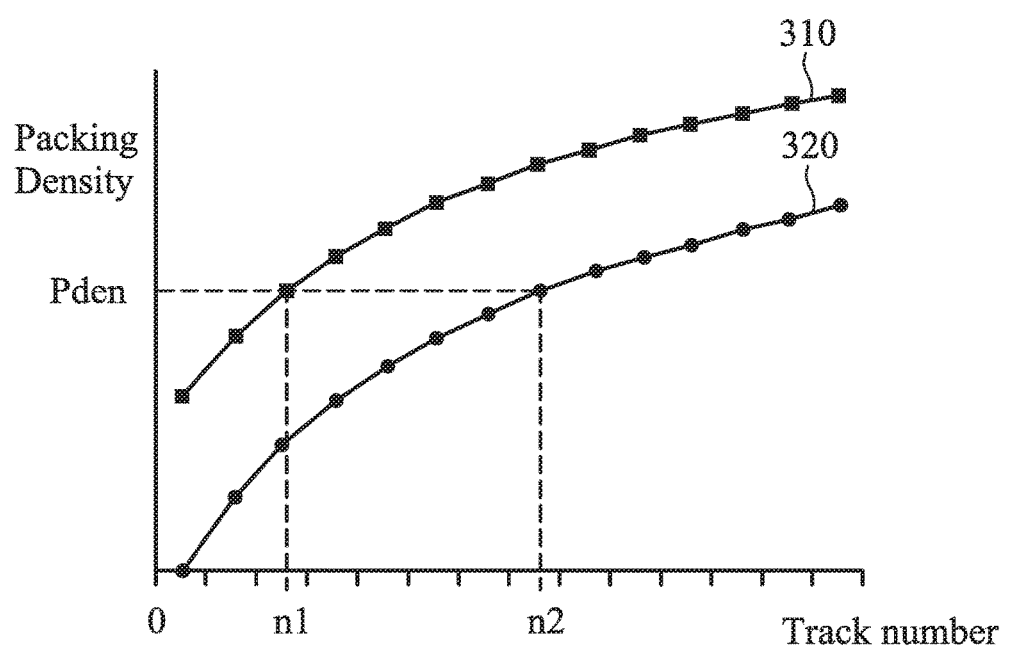
FIG. 3 shows a schematic illustrating a relationship between the track number and the packing density of the double height cell and the single height cell according to an embodiment of the invention.

FIG. 3 shows a schematic illustrating a relationship between the track number and the packing density of the double height cell and the single height cell according to an embodiment of the invention, wherein the track number is used to represent a height of a standard cell. In FIG. 3, curve 310 represents a property of the single height cell, and curve 320 represents a property of the double height cell. If comparison is made with the same packing density (e.g. Pden), the double height cell has a larger track number than that of the single height cell, i.e. n2>n1. Thus, the double height cell is good for power, area and timing optimization.

Figure 4:
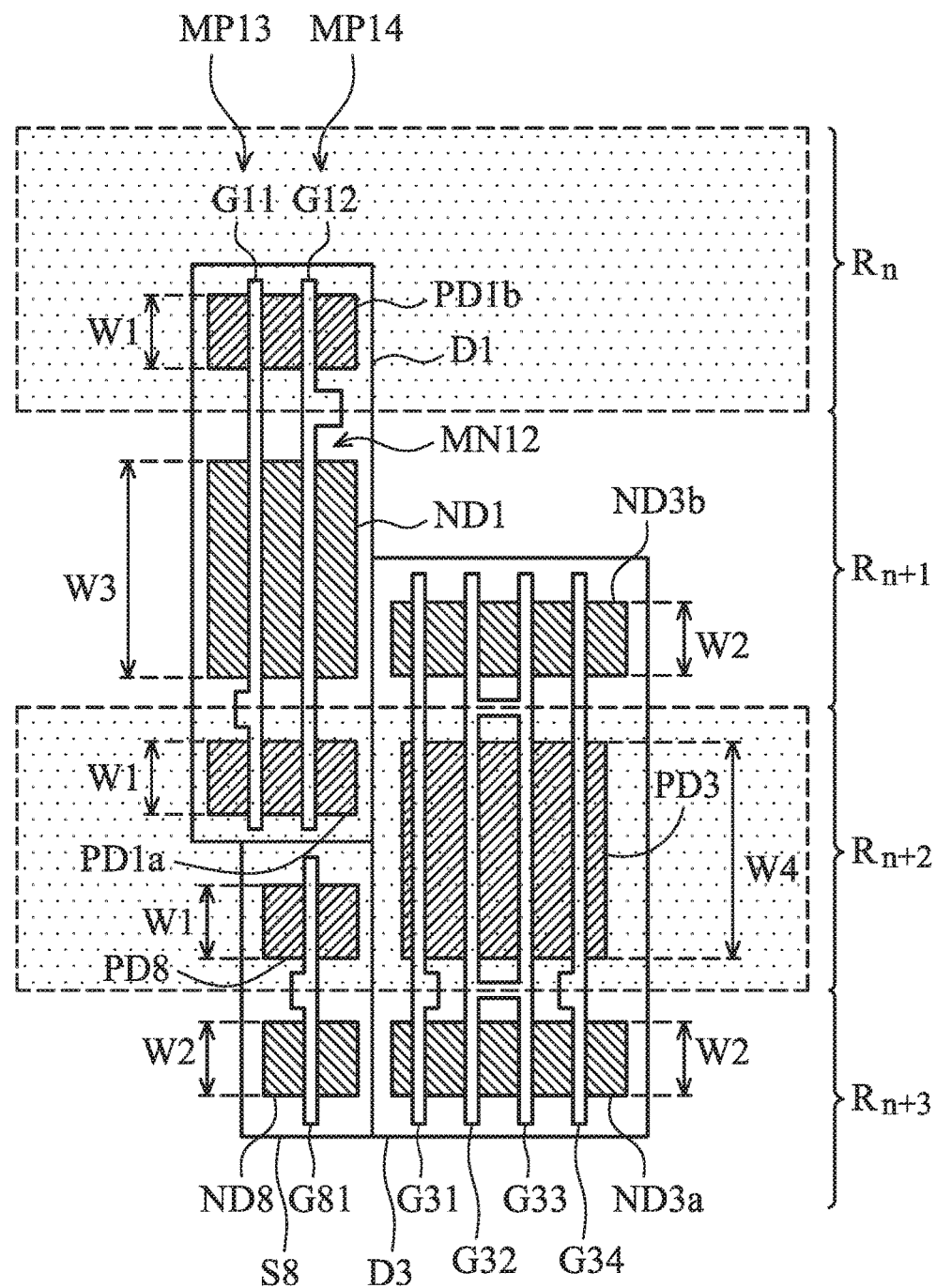
FIG. 4 shows an example illustrating a layout diagram of the standard cells D1, D3 and S8 of FIG. 1 according to an embodiment of the invention.

FIG. 4 shows an example illustrating a layout diagram of the standard cells D1, D3 and S8 of FIG. 1 according to an embodiment of the invention. The standard cell D1 has be described in FIG. 2. In the standard cell S8, a gate G81 and a P+ doping region PD8 adjacent to the gate G81 form a PMOS transistor in the row $R_{n+2}$, and the gate G81 and an N+ doping region ND8 adjacent to the gate G81 form an NMOS transistor in the row $R_{n+3}$. In the row $R_{n+2}$, the P+ doping regions PD1$a$ and PD8 have the same height (e.g. W1), thus each gate of the PMOS transistors in the standard cell D1 and the gate of the PMOS transistor in the standard cell S8 have the same width W1. The height (e.g. W3) of the N+ doping region ND1 in the row $R_{n+1}$ is at least twice the height (e.g. W2) of the N+ doping region ND8 in the row $R_{n+3}$, thereby each gate of the NMOS transistors in the standard cell D1 has at least twice width of the gate of the NMOS transistor in the standard cell S8, i.e. W3≥2×W2. Furthermore, in the standard cell D3, the gates G31-G34 and the P+ doping region PD3 adjacent to each gate form a plurality of PMOS transistor in the row $R_{n+2}$. Furthermore, the gates G31-G34 and the N+ doping region ND3$a$ adjacent to each gate form a plurality of NMOS transistors in the row $R_{n+3}$, and the gates G31-G34 and the N+ doping region ND3$b$ adjacent to each gate form a plurality of NMOS transistors in the row $R_{n+1}$. It is to be noted that a quantity of the NMOS transistors in the N+ doping region ND3$b$ of the row $R_{n+1}$ is equal to a quantity of the NMOS transistors in the N+ doping region ND3$a$ of the row $R_{n+3}$. In the row $R_{n+2}$, the height (e.g. W4) of the P+ doping region PD3 is at least twice the height (e.g. W1) of the P+ doping region PD8, thereby each gate of the PMOS transistors in the standard cell D3 has at least twice width of each gate of the PMOS transistors in the standard cell D1, i.e. W4≥2×W1. In the row $R_{n+1}$, the height (e. g. W3) of the N+ doping region ND1 is at least twice the height (e.g. W2) of the N+ doping region ND3$b$, thereby each gate of the NMOS transistors in the standard cell D1 has at least twice width of the gate of the NMOS transistor in the standard cell D3, i.e. W3≥2×W2.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An integrated circuit, comprising:
a first standard cell, comprising at least one first PMOS transistor disposed in a first row in a semiconductor substrate and at least one first NMOS transistor disposed in a first area of a second row in the semiconductor substrate; and
a second standard cell, comprising a plurality of second PMOS transistors disposed in the first row and a third row in the semiconductor substrate and a plurality of second NMOS transistors disposed in a second area of the second row in the semiconductor substrate, wherein the second row is adjacent to the first and third rows and arranged between the first and third rows.

2. The integrated circuit as claimed in claim 1, wherein a height of the second area is larger than a height of the first area in the second row.

3. The integrated circuit as claimed in claim 1, wherein a width of each gate of the second NMOS transistors in the second area of the second row is at least twice a width of a gate of the first NMOS transistor in the first area of the second row.

4. The integrated circuit as claimed in claim 1, wherein half of the second PMOS transistors are disposed in the first row, wherein a width of a gate of the first PMOS transistors is equal to a width of each gate of the second PMOS transistors in the first row.

5. The integrated circuit as claimed in claim 4, wherein the other half of the second PMOS transistors are disposed in the third row and coupled to the half of the second PMOS transistors in the first row via a plurality of individual gates, respectively, wherein the width of each gate of the second PMOS transistors in the first row is equal to a width of each gate of the second PMOS transistors in the third row.

6. The integrated circuit as claimed in claim 1, wherein the first standard cell is a single height cell, and the second standard cell is a double height cell.

7. The integrated circuit as claimed in claim 1, further comprising:
a third standard cell, comprising at least one third PMOS transistor disposed in the third row in the semiconductor substrate and at least one third NMOS transistor disposed in a third area of the second row in the semiconductor substrate.

8. The integrated circuit as claimed in claim 7, wherein a height of the second area is larger than a height of the third area in the second row.

9. The integrated circuit as claimed in claim 6, wherein the first and third standard cells are single height cells, and the second standard cell is a double height cell.

10. An integrated circuit, comprising:
   a first standard cell, comprising at least one first NMOS transistor disposed in a first row in a semiconductor substrate and at least one first PMOS transistor disposed in a first area of a second row in the semiconductor substrate; and
   a second standard cell, comprising a plurality of second PMOS transistors disposed in a third row and a second area of the second row in the semiconductor substrate and a plurality of second NMOS transistors disposed in a fourth row in the semiconductor substrate,
   wherein the second row is adjacent to the first and fourth rows and arranged between the first and fourth rows, and the fourth row is adjacent to the second and third rows and arranged between the second and third rows.

11. The integrated circuit as claimed in claim 10, wherein a width of each gate of the second NMOS transistor in the fourth row is at least twice a width of a gate of the first NMOS transistor in the first row.

12. The integrated circuit as claimed in claim 10, wherein half of the second PMOS transistors are disposed in the second area of the second row, wherein a width of a gate of the first PMOS transistors is equal to a width of each gate of the second PMOS transistors in the second row.

13. The integrated circuit as claimed in claim 12, wherein the other half of the second PMOS transistors are disposed in the third row and coupled to the half of the second PMOS transistors in the second row via a plurality of individual gates, respectively, wherein the width of each gate of the second PMOS transistors in the second row is equal to a width of each gate of the second PMOS transistors in the third row.

14. The integrated circuit as claimed in claim 10, wherein the first standard cell is a single height cell, and the second standard cell is a double height cell.

15. The integrated circuit as claimed in claim 10, further comprising:
   a third standard cell, comprising at least one third NMOS transistor disposed in the first row in the semiconductor substrate and at least one third PMOS transistor disposed in a third area of the second row in the semiconductor substrate.

16. The integrated circuit as claimed in claim 15, wherein the first, second and third areas are adjacent to each other in the second row.

17. The integrated circuit as claimed in claim 15, wherein the first and third standard cells are single height cells, and the second standard cell is a double height cell.

* * * * *